United States Patent
An et al.

(10) Patent No.: US 10,403,735 B2
(45) Date of Patent: Sep. 3, 2019

(54) METHOD OF FORMING SEMICONDUCTOR DEVICE INCLUDING P-N DIODE

(71) Applicant: SAMSUNG ELECTRONICS CO., LTD., Suwon-si, Gyeonggi-do (KR)

(72) Inventors: Ho Kyun An, Seoul (KR); Dong Hyun Im, Suwon-si (KR)

(73) Assignee: Samsung Electronics Co., Ltd., Suwon-Si, Gyeonggi-do (KR)

(*) Notice: Subject to any disclaimer, the term of this patent is extended or adjusted under 35 U.S.C. 154(b) by 396 days.

(21) Appl. No.: 15/409,877

(22) Filed: Jan. 19, 2017

(65) Prior Publication Data

US 2018/0019318 A1   Jan. 18, 2018

(30) Foreign Application Priority Data

Jul. 14, 2016   (KR) .................. 10-2016-0089241

(51) Int. Cl.
*H01L 29/66* (2006.01)
*H01L 27/24* (2006.01)
(Continued)

(52) U.S. Cl.
CPC .... *H01L 29/66136* (2013.01); *H01L 27/2409* (2013.01); *H01L 27/2463* (2013.01); *H01L 29/0684* (2013.01); *H01L 29/36* (2013.01); *H01L 29/861* (2013.01); *H01L 27/224* (2013.01); *H01L 45/06* (2013.01);
(Continued)

(58) Field of Classification Search
CPC . H01L 45/145–147; H01L 47/16–1691; H01L 29/66136; H01L 29/8611; H01L 29/8613; H01L 29/6603; H01L 29/6606; H01L 29/66204; H01L 2924/12036; G11C 11/5678; G11C 11/5685; G11C 13/007–0019; G11C 13/0021–0097; G11C 14/0045; G11C 14/009; G11C 2213/10–19; G11C 2213/30–35; G11C 2213/50–56; G11C 2213/70–82
See application file for complete search history.

(56) References Cited

U.S. PATENT DOCUMENTS 5,338,697 A   8/1994   Aoki et al.
5,969,398 A   10/1999   Murakami
(Continued)

*Primary Examiner* — Stephen W Smoot
*Assistant Examiner* — Sun Mi Kim King
(74) *Attorney, Agent, or Firm* — Lee & Morse, P.C.

(57) ABSTRACT

Forming a semiconductor device includes forming a first conductive line on a substrate, forming a memory cell including a switching device and a data storage element on the first conductive line, and forming a second conductive line on the memory cell. Forming the switching device includes forming a first semiconductor layer, forming a first doped region by injecting a n-type impurity into the first semiconductor layer, forming a second semiconductor layer thicker than the first semiconductor layer, on the first semiconductor layer having the first doped region, forming a second doped region by injecting a p-type impurity into an upper region of the second semiconductor layer, and forming a P-N diode by performing a heat treatment process to diffuse the n-type impurity and the p-type impurity in the first doped region and the second doped region to form a P-N junction of the P-N diode in the second semiconductor layer.

20 Claims, 13 Drawing Sheets

(51) Int. Cl.
    *H01L 29/06*     (2006.01)
    *H01L 29/861*     (2006.01)
    *H01L 29/36*     (2006.01)
    *H01L 27/22*     (2006.01)
    *H01L 45/00*     (2006.01)

(52) U.S. Cl.
    CPC ........ *H01L 45/1233* (2013.01); *H01L 45/144* (2013.01); *H01L 45/1675* (2013.01)

(56) References Cited

U.S. PATENT DOCUMENTS

| | | | |
|---|---|---|---|
| 6,048,782 | A | 4/2000 | Moslehi |
| 6,180,444 | B1 * | 1/2001 | Gates ................. H01L 27/0814 257/E21.358 |
| 6,489,207 | B2 | 12/2002 | Furukawa et al. |
| 7,176,116 | B2 | 2/2007 | Cabral, Jr. et al. |
| 2002/0098716 | A1 * | 7/2002 | Gonzalez .......... H01L 21/02532 438/797 |
| 2005/0164469 | A1 | 7/2005 | Haupt |
| 2008/0200014 | A1 * | 8/2008 | Park .................... H01L 21/0237 438/486 |
| 2012/0187360 | A1 * | 7/2012 | Eungyoon ............. G11C 11/161 257/2 |
| 2012/0326110 | A1 * | 12/2012 | Oh ......................... H01L 45/06 257/1 |
| 2015/0079773 | A1 | 3/2015 | Basker et al. |

\* cited by examiner

METHOD OF FORMING SEMICONDUCTOR DEVICE INCLUDING P-N DIODE

CROSS-REFERENCE TO RELATED APPLICATION

Korean Patent Application No. 10-2016-0089241, filed on Jul. 14, 2016, in the Korean Intellectual Property Office, and entitled: "Method of Forming Semiconductor Device Including P-N Diode," is incorporated by reference herein in its entirety.

BACKGROUND

1. Field

Embodiments relate to a method of forming a semiconductor device including a
P-N diode and a semiconductor device formed using the method.

2. Description of the Related Art

In general, semiconductor devices, such as a phase-change random-access memory (PRAM), a resistive random-access memory (RRAM), or the like may include memory cells containing a switching device and a data storage element. According to the tendency for high integration in semiconductor devices, P-N diodes have been used as switching devices, rather than metal oxide semiconductor (MOS) transistors.

SUMMARY

Embodiments are directed to a method of forming a semiconductor device including forming a first conductive line on a substrate, forming a memory cell including a switching device and a data storage element on the first conductive line, and forming a second conductive line on the memory cell. Forming the switching device includes forming a first semiconductor layer, forming a first doped region using a first doping process of injecting a n-type impurity into the first semiconductor layer, forming a second semiconductor layer to be thicker than the first semiconductor layer, on the first semiconductor layer having the first doped region, forming a second doped region using a second doping process of injecting a p-type impurity into an upper region of the second semiconductor layer, and forming a P-N diode by performing a heat treatment process to diffuse the n-type impurity and the p-type impurity in the first doped region and the second doped region such that a P-N junction of the P-N diode is formed in the second semiconductor layer.

Embodiments are also directed to a method of forming a semiconductor device including forming a first semiconductor layer on a lower conductive layer, the first semiconductor layer being formed of a first undoped silicon layer, forming a first doped region including an n-type impurity in the first semiconductor layer using a first doping process, forming a second semiconductor layer to be thicker than the first semiconductor layer, on the first semiconductor layer including the first doped region, the second semiconductor layer being formed of a second undoped silicon layer, forming a second doped region including a p-type impurity in an upper region of the second semiconductor layer using a second doping process, and forming a P-N diode in which a P-N junction is formed in the second semiconductor layer by performing a heat treatment process to diffuse the n-type impurity and the p-type impurity in the first doped region and the second doped region.

Embodiments are also directed to a method of forming a semiconductor device, including forming a first semiconductor layer of undoped silicon on a first conductive layer, forming a first doped region including an n-type impurity in the first semiconductor layer, forming a second semiconductor layer of undoped silicon on first semiconductor layer including the first doped region, forming a second doped region including a p-type impurity in an upper region of the second semiconductor layer, performing a heat treatment process to diffuse the n-type impurity and the p-type impurity in the first doped region and the second doped region to form a first P-N diode including a first P-N junction in the second semiconductor layer, forming a first electrode layer on the first P-N diode, forming a first data storage element on the first electrode layer, forming a second electrode layer on the first data storage element, and forming an second conductive layer on the second electrode layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
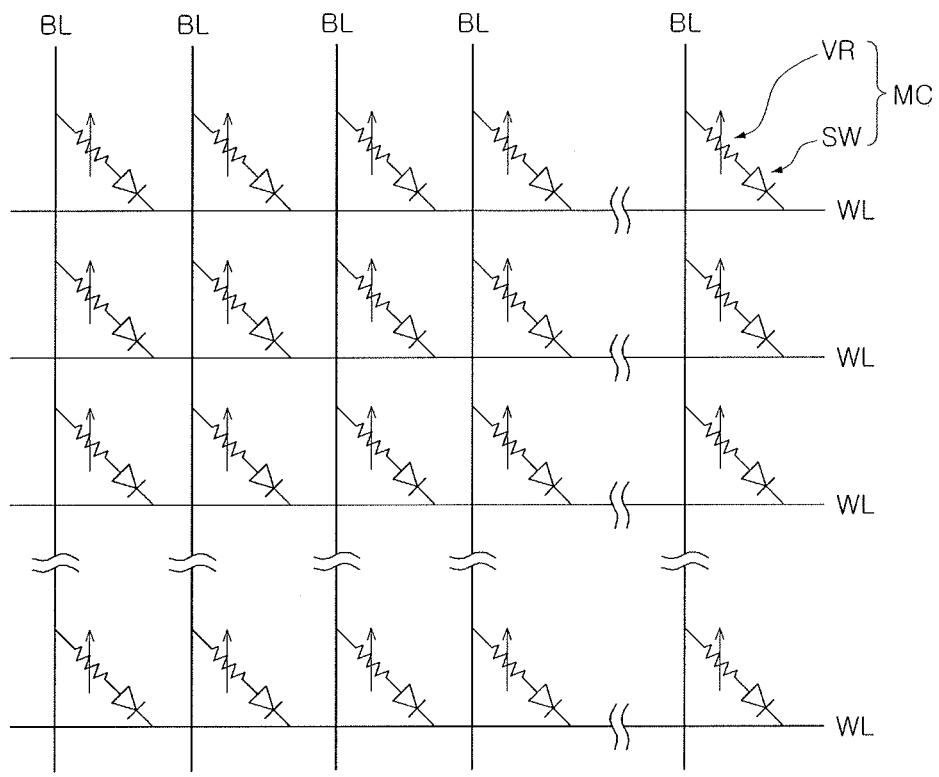
FIG. 1 illustrates a block diagram of a semiconductor device according to an example embodiment.

Example embodiments will now be described more fully hereinafter with reference to the accompanying drawings; however, they may be embodied in different forms and should not be construed as limited to the embodiments set forth herein. Like reference numerals refer to like elements throughout.

Figure 2:
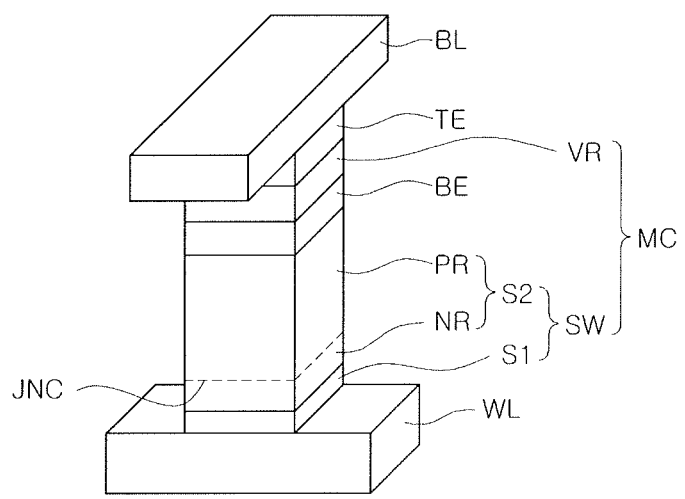
FIG. 2 illustrates a perspective view of a semiconductor device according to an example embodiment.
Figure 3:
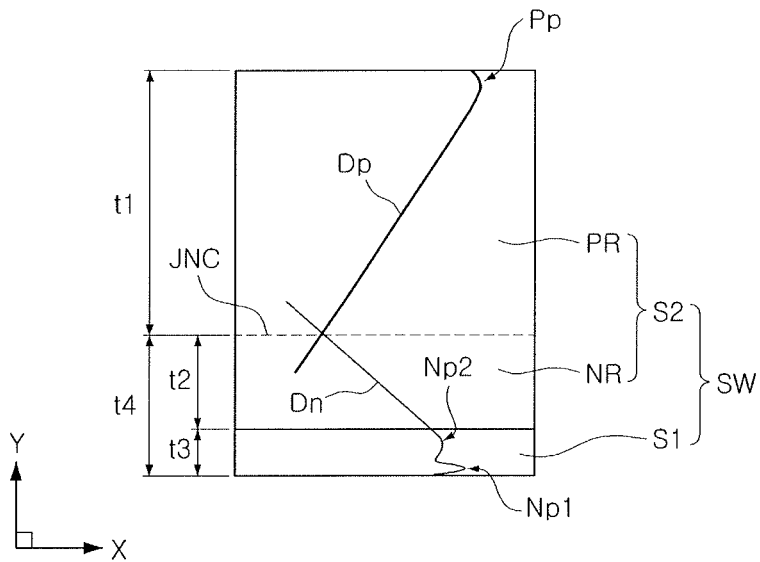
FIG. 3 illustrates a view of a P-N diode of a semiconductor device according to an example embodiment.

FIG. 1 illustrates a block diagram of a semiconductor device according to an example embodiment, FIG. 2 illustrates a perspective view of a semiconductor device according to an example embodiment, and FIG. 3 illustrates a view depicting a P-N diode and an impurity concentration in the P-N diode. In FIG. 3, "Dn" refers to an n-type impurity concentration, and "Dp" refers to a p-type impurity concentration. In FIG. 3, the X axis also indicates a doping concentration of Dn and Dp with respect to a location in the semiconductor device in the Y direction.

With reference to FIGS. 1, 2, and 3, a semiconductor device according to an example embodiment may include a first conductive line WL, a second conductive line BL intersecting the first conductive line WL, and a memory cell MC disposed between the first conductive line WL and the second conductive line BL. The first conductive line WL may be a word line. The second conductive line BL may be a bit line.

Respective memory cells MC may include a switching device SW and a data storage element VR. The switching device SW may be the P-N diode as illustrated in FIGS. 2 and 3. Herein, the terms "switching device SW" and "P-N diode SW" may be used interchangeably to refer to the same structure.

The first conductive line WL may include a metal (e.g., tungsten (W) or the like), a metallic nitride (e.g., titanium nitride (TiN), tungsten nitride (WN), or the like), or a metallic silicide (e.g., titanium silicide (TiSi), tungsten silicide (WSi), or the like) or combinations thereof. The switching device SW may be disposed on the first conductive line WL. The switching device SW may include a first semiconductor layer S1 and a second semiconductor layer S2 disposed on the first semiconductor layer S1. The first semiconductor layer S1 and the second semiconductor layer S2 may be formed using a polysilicon material.

The first semiconductor layer S1 may have n-type conductivity. The second semiconductor layer S2 may include a first region NR having n-type conductivity and a second region PR having p-type conductivity. An interface between the first region NR and the second region PR may be a P-N junction JNC of the P-N diode. The P-N junction JNC may be formed in the second semiconductor layer S2.

An n-type impurity concentration Dn in the switching device SW (the P-N diode SW) may include a first peak Np1 and a second peak Np2 lower than the first peak Np1, in the first semiconductor layer S1. The first peak Np1 is a portion in which the n-type impurity concentration Dn is the highest, and the second peak Np2 is a portion in which the n-type impurity concentration Dn is the second highest. The first peak Np1 and the second peak Np2 of the n-type impurity concentration Dn may be formed in the first semiconductor layer S1.

In the first semiconductor layer S1, the first peak Np1 of the n-type impurity concentration Dn will be referred to herein as a "first peak region", or a "maximum peak region", while the second peak Np2 will be referred to herein as "a second peak region".

The second peak Np2 of the n-type impurity concentration Dn may be located more adjacently to an upper surface of the first semiconductor layer S1 than to a lower surface thereof. The first peak Np1 of the n-type impurity concentration Dn may be located more adjacently to the lower surface of the first semiconductor layer S1 than to the upper surface thereof.

The n-type impurity concentration Dn may increase in a spike shape in a portion located adjacent to a bottom surface of the first semiconductor layer S1, thus forming the first peak Np1. The n-type impurity concentration Dn may gradually decrease in a direction from the second peak Np2 toward the P-N junction JNC.

A p-type impurity concentration Dp in the P-N diode SW may form a maximum peak Pp in an upper region of the second semiconductor layer S2, and may gradually decrease in a direction toward the P-N junction JNC. In the second semiconductor layer S2, the maximum peak Pp of the p-type impurity concentration Dp is referred to herein as the "maximum peak region".

The P-N junction JNC may be located more adjacently to a lower surface of the second semiconductor layer S2 than to an upper surface thereof. The P-N junction JNC may be located more adjacently to the lower surface of the first semiconductor layer S1 than to the upper surface of the second semiconductor layer S2. A distance between the P-N junction JNC and the maximum peak Pp of the p-type impurity concentration Dp may be greater than a distance between the P-N junction JNC and the first peak Np1 of the n-type impurity concentration Dn.

A distance t1 between the P-N junction JNC and the upper surface of the second semiconductor layer S2 may be greater than a distance t2 between the P-N junction JNC and the lower surface of the second semiconductor layer S2. The distance t1 between the P-N junction JNC and the upper surface of the second semiconductor layer S2 may be greater than a distance t4 between the P-N junction JNC and the lower surface of the first semiconductor layer S1. The distance t2 between the upper surface of the first semiconductor layer S1 and the P-N junction JNC may be greater than a thickness t3 of the first semiconductor layer S1. A thickness of the first semiconductor layer S1 may be in a range of about 10 Å to about 50 Å.

The data storage element VR may be formed on the switching device SW. A first electrode BE may be formed between the data storage element VR and the switching device SW. A second electrode TE may be formed between the data storage element VR and the second conductive line BL.

In an example embodiment, the data storage element VR may include a phase-change material that is changeable to have a crystalline state or an amorphous state, depending on an electric current applied thereto. For example, the phase-change material used as the data storage element VR may be a chalcogenide-based material including a germanium (Ge) element, an antimony (Sb) element and/or a tellurium (Te) element. In other implementations, the data storage element VR may include a material such as a perovskite-based material layer or a transition metal oxide layer that is changeable to have a high resistivity or a low resistivity by applying an electrical signal,. In some implementations, the data storage element VR may include a material the resistivity of which is changeable by a magnetic field or spin transfer torque.

A method of forming a semiconductor device according to an example embodiment may include forming the first conductive line WL, forming the memory cell MC including the switching device SW and the data storage element VR, on the first conductive line WL, and forming the second conductive line BL on the memory cell MC.

A method of forming a semiconductor device according to example embodiments will be described hereinafter with reference to FIG. 4 and FIGS. 5A to 5E.

Figure 4:
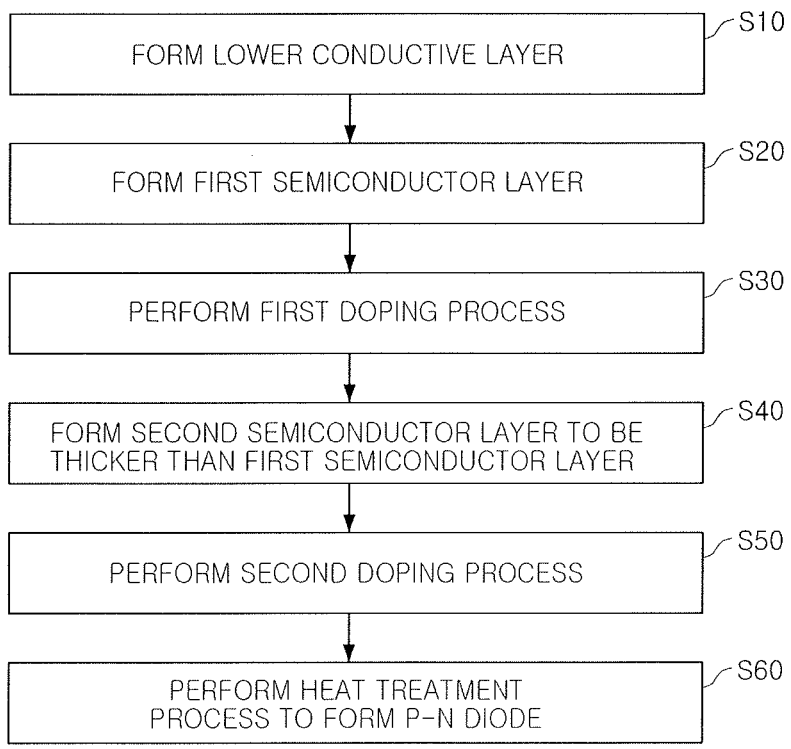
FIG. 4 illustrates a flow chart of a method of forming a semiconductor device according to an example embodiment.
Figure 5A:
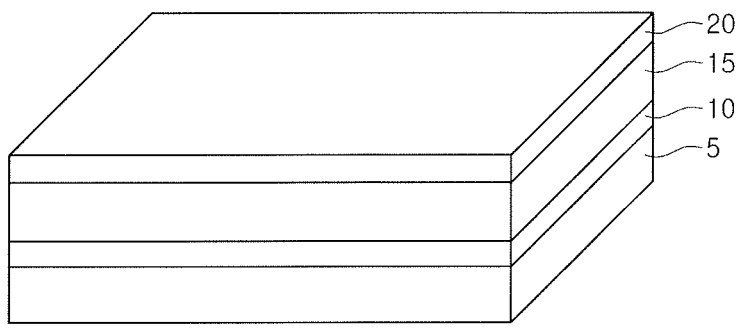
FIGS. 5A to 5E illustrate perspective views of stages of a method of forming a semiconductor device according to an example embodiment.

With reference to FIGS. 4 and 5A, a lower conductive layer 15 may be formed (S10) on a lower insulating layer 10 on a semiconductor substrate 5. The semiconductor substrate 5 may be a single crystal silicon substrate. The lower insulating layer 10 may be formed of an insulating material, such as a silicon oxide, a silicon nitride, or the like.

The lower conductive layer 15 may include a metallic material. For example, the lower conductive layer 15 may include a metal (e.g., W, or the like), a metallic nitride (e.g., TiN, WN, or the like), or a metallic silicide (e.g., TiSi, WSi, or the like) or combinations thereof.

A first semiconductor layer 20 may be formed on the lower conductive layer 15 (S20). The first semiconductor layer 20 may be formed using an undoped polysilicon material. A thickness of the first semiconductor layer 20 may be in a range of about 10 Å to about 50 Å.

Figure 5B:
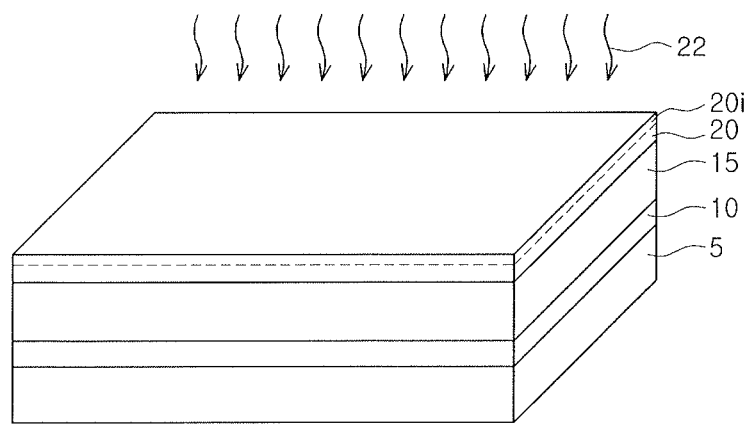

With reference to FIGS. 4 and 5B, a first doping process 22 may be performed (S30). The first doping process 22 may be a process of injecting an n-type impurity, such as phosphorus (P), arsenic (As), or the like, into the first semiconductor layer 20.

The first doping process 22 may be performed at a temperature of about 400° C. to about 600° C. The first doping process 22 may be performed, for example, using a gas phase doping (GPD) process. In some implementations, the first doping process 22 may be performed using a plasma doping process.

A first doped region 20*i* may be formed in an upper region of the first semiconductor layer 20 by the first doping process 22. In the first semiconductor layer 20, a region not included in the first doped region 20*i* may not be doped.

Figure 5C:
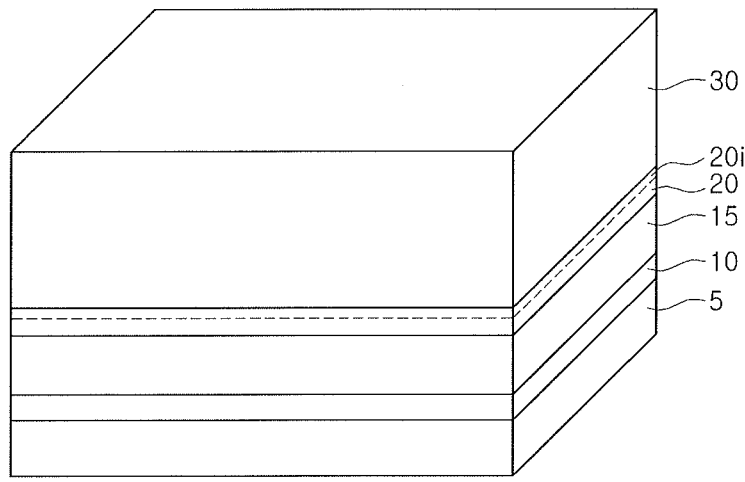

With reference to FIGS. 4 and 5C, a second semiconductor layer 30 may be formed (S40). The second semiconductor layer 30 may be formed on the first semiconductor layer 20 including the first doped region 20*i*. The second semiconductor layer 30 may be formed using an undoped polysilicon material. The second semiconductor layer 30 may be thicker than the first semiconductor layer 20. For example, the second semiconductor layer 30 may be about 5 to about 15 times thicker than the first semiconductor layer 20.

Figure 5D:
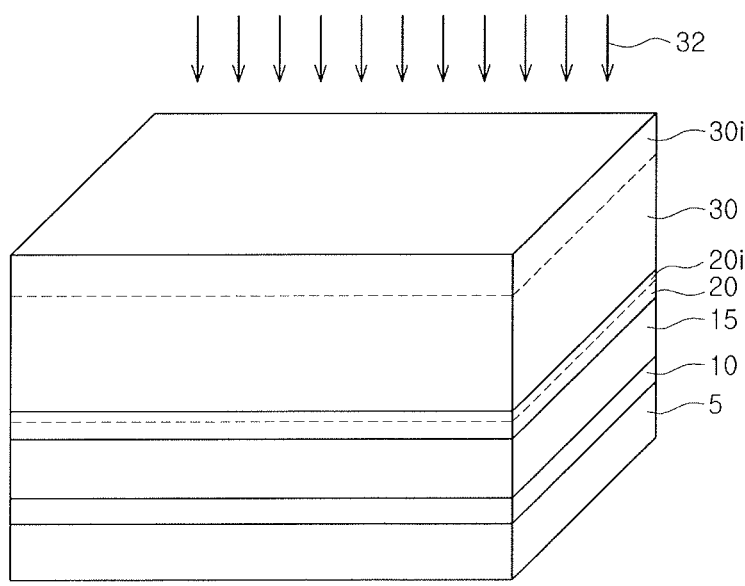

With reference to FIGS. 4 and 5D, a second doping process 32 may be performed (S50). The second doping process 32 may be a process of injecting a p-type impurity, such as boron B, into an upper region of the second semiconductor layer 30. A second doped region 30*i* may be formed in the upper region of the second semiconductor layer 30 using the second doping process 32.

Figure 5E:
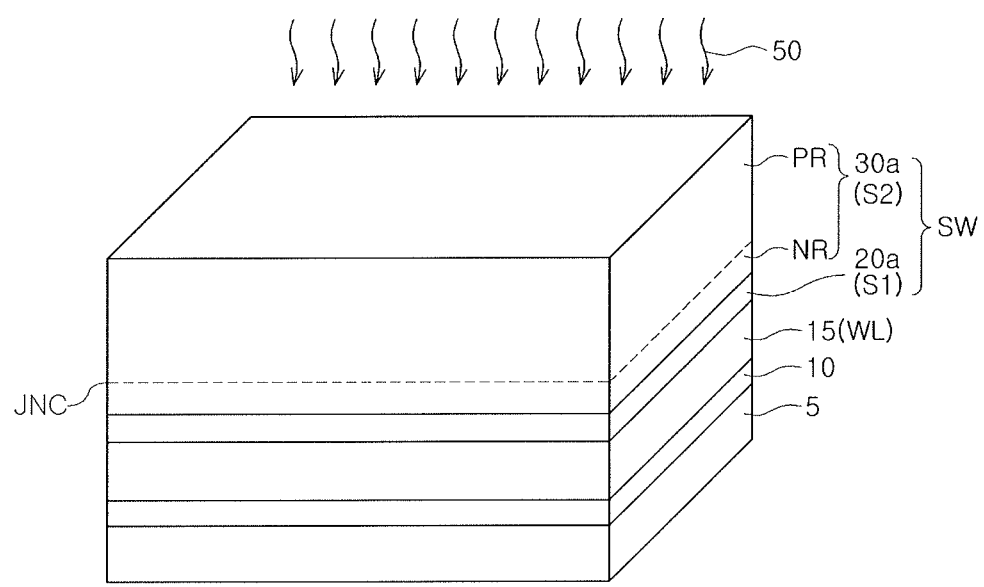

With reference to FIGS. 4 and 5E, a P-N diode SW may be formed by performing a heat treatment process 50 (S60). The P-N diode SW may be a switching device. The heat treatment process 50 may be performed at a temperature of about 800° C. to about 1,300° C.

Through the heat treatment process 50, the first semiconductor layer (20 in FIG. 5D) may be formed as a first semiconductor layer 20*a* including n-type conductivity. The second semiconductor layer (30 in FIG. 5D) may be formed as a second semiconductor layer 30*a* including a first region NR having n-type conductivity and a second region PR having p-type conductivity. A P-N junction JNC may be formed in the second semiconductor layer 30*a*. The first region NR of the second semiconductor layer 30*a* may be in contact with the first semiconductor layer 20*a*.

The first semiconductor layer 20*a* may correspond to the first semiconductor layer S1 illustrated in FIGS. 1 to 3, and the second semiconductor layer 30*a* may correspond to the second semiconductor layer S2 illustrated in FIGS. 1 to 3.

Through the heat treatment process 50, an impurity of the first doped region (20*i* in FIG. 5D) may be diffused to provide the doping profile illustrated as "Dn" in FIG. 3. In addition, the impurity of the second doped region (30*i* in FIG. 5D) may be diffused to provide the doping profile illustrated as "Dp" in FIG. 3. Accordingly, the P-N diode SW may be formed to have the doping profile illustrated in FIG. 3. Here, since an n-type impurity concentration and a p-type impurity concentration in the P-N diode SW are illustrated in FIG. 3, detailed descriptions will thereof will not be repeated hereinafter.

<Experimental Example>

Figure 6A:
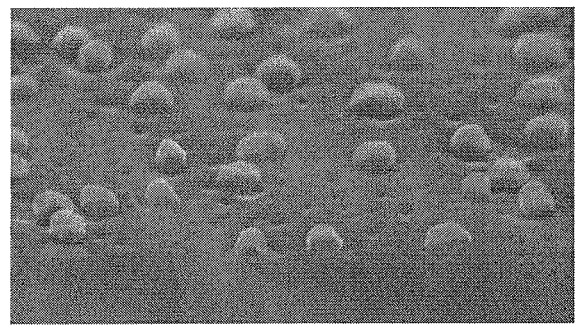
FIGS. 6A to 6C illustrate images of comparative polysilicon.
Figure 6B:
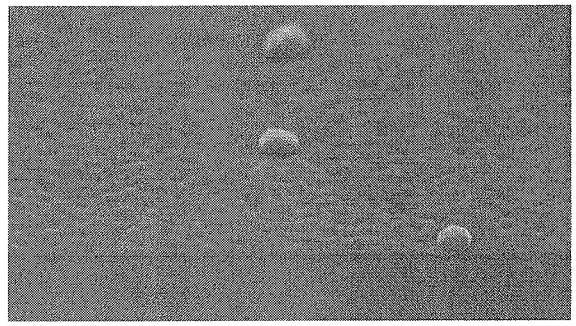
Figure 6C:
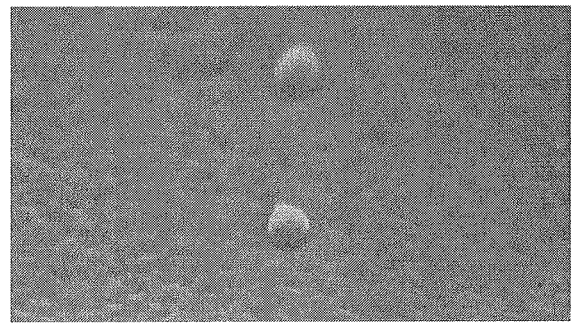
Figure 7:
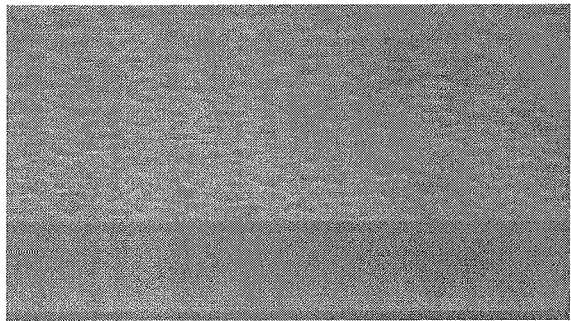
FIG. 7 illustrates an image of polysilicon formed based on an example of a method of forming a semiconductor device according to an example embodiment.

FIG. 6A illustrates an image of an in-situ doped polysilicon layer deposited to have a thickness of 50 Å, FIG. 6B is an image of an in-situ doped polysilicon layer deposited to have a thickness of 100 Å, and FIG. 6C is an image of an in-situ doped polysilicon layer deposited to have a thickness of 140A. FIG. 7 is an image of an undoped polysilicon layer deposited to have a thickness of 50 Å. The undoped polysilicon layer of FIG. 7 may be the first semiconductor layer 20 illustrated in FIG. 5A.

As illustrated in FIGS. 6A to 6C, in a case in which the thickness of the in-situ doped polysilicon layer is 140 Å or less, surface morphology of the in-situ doped polysilicon layer may not be appropriate for forming a P-N diode. On the other hand, the undoped polysilicon layer according to example embodiments, for example, the first semiconductor layer (20 in FIG. 5A), having the thickness of 50 Å, may have an appropriate surface morphology. Therefore, a P-N diode used as the switching device (SW in FIG. 5E) may be formed to have a relatively small size and reliability.

According to example embodiments, in the P-N diode SW used as the switching device of the memory cell MC, the first semiconductor layer S1 may be formed to have the thickness of about 50 Å or less. When a size of the P-N diode SW is reduced, a degree of integration in a semiconductor device may be increased.

According to example embodiments, the first semiconductor layer S1 may be formed to have the thickness of about 10 Å to about 50 Å, while the second semiconductor layer S2 may be formed to be about 5 to about 15 times thicker than the first semiconductor layer S1. The first doped region (20*i* in FIG. 5B) and the second doped region (30*i* in FIG. 5D) may be formed on surfaces or in upper regions of the first semiconductor layer S1 and the second semiconductor layer S2, and the P-N diode SW. Impurity concentration profiles Dn and Dp, as illustrated in FIG. 3, may be formed in such a manner that an impurity concentration and a depth of the P-N junction JNC is relatively easily controlled using a semiconductor process of performing the heat treatment process (50 in FIG. 5E). Therefore, an off current (Ioff) of memory cells adopting the P-N diode SW as the switching device may be reduced.

Subsequently, with reference to FIGS. 8A to 8C, stages of a method of forming a semiconductor device according to example embodiments will be described.

Figure 8A:
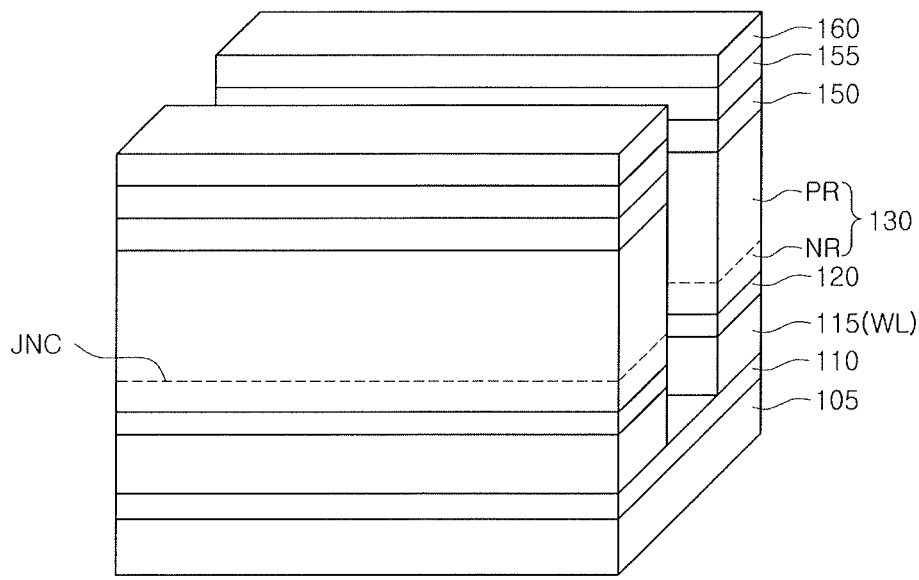
FIGS. 8A to 8C illustrate perspective views of stages of a method of forming a semiconductor device according to an example embodiment.

With reference to FIG. 8A, a lower insulating layer 110 may be formed on a substrate 105. The substrate 105 may be a semiconductor substrate. A lower conductive layer 115, a first semiconductor layer 120, a second semiconductor layer 130, a first electrode layer 150, a data storage element 155, and a second electrode layer 160, may be stacked on the lower insulating layer 110 in a linear manner in sequence.

Forming the lower conductive layer 115, the first semiconductor layer 120, the second semiconductor layer 130, the first electrode layer 150, the data storage element 155, and the second electrode layer 160 may include forming the lower conductive layer (15 in FIG. 5E), the first semiconductor layer (20*a* in FIG. 5E), and the second semiconductor layer (30*a* in FIG. 5E) on the lower insulating layer 110 in sequence, and forming the first electrode layer 150, the data storage element 155, and the second electrode layer 160 on the second semiconductor layer (30*a* in FIG. 5E) in sequence, using the method as illustrated in FIGS. 5A to 5E, and performing a line-and-space patterning process. The line-and-space patterning process may include a photolithography and etching process of forming a line pattern.

The lower conductive layer 115 may be provided as the first conductive line illustrated in FIGS. 1 and 2. For example, the lower conductive layer 115 may be a word line WL. The first electrode layer 150 and the second electrode layer 160 may include a conductive material. The data storage element 155 may correspond to the data storage element VR illustrated in FIGS. 1 and 2.

Figure 8B:
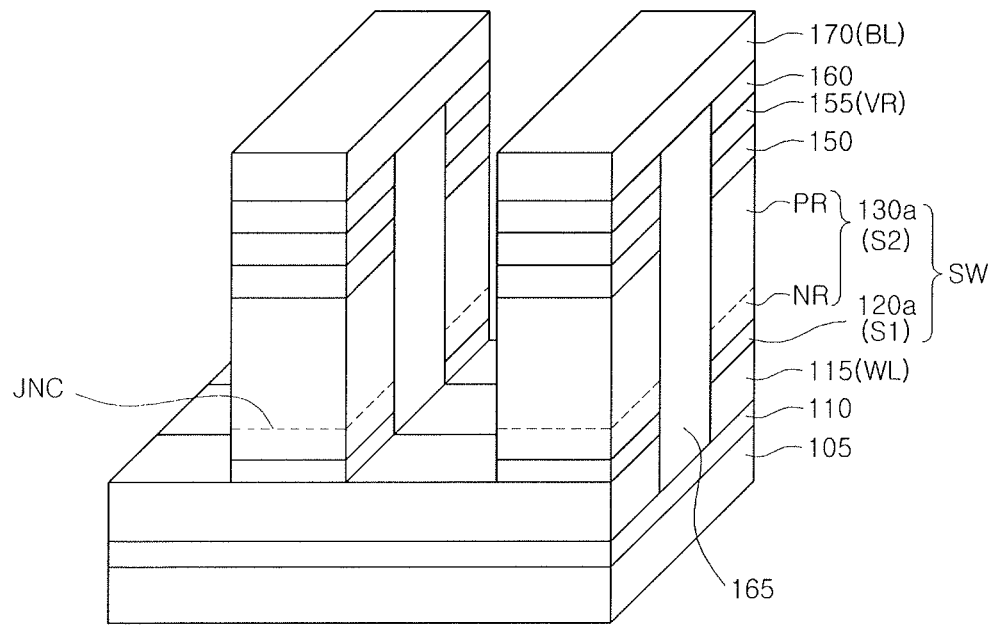

With reference to FIG. 8B, a first insulating layer 165 may be deposited on the substrate including the lower conductive layer 115, the first semiconductor layer 120, the second semiconductor layer 130, the first electrode layer 150, the data storage element 155, and the second electrode layer 160. The first insulating layer 165 may be polished until the second electrode layer 160 is exposed. An upper conductive layer 170 having a line shape and intersecting the lower conductive layer 115 having the line shape may be formed on the first insulating layer 165 and the second electrode layer 160. The first semiconductor layer 120, the second semiconductor layer 130, the first electrode layer 150, the data storage element 155, and the second electrode layer 160 may be etched such that the first semiconductor layer 120, the second semiconductor layer 130, the first electrode layer 150, the data storage element 155, and the second electrode layer 160 remain between the upper conductive layer 170 and the lower conductive layer 115. The upper conductive layer 170 may be provided as the second conductive line illustrated in FIGS. 1 and 2. For example, the upper conductive layer 170 may be a bit line BL.

In an example embodiment, when the first semiconductor layer 120, the second semiconductor layer 130, the first electrode layer 150, the data storage element 155, and the second electrode layer 160 are etched, the first insulating layer 165 may also be etched simultaneously.

Figure 8C:
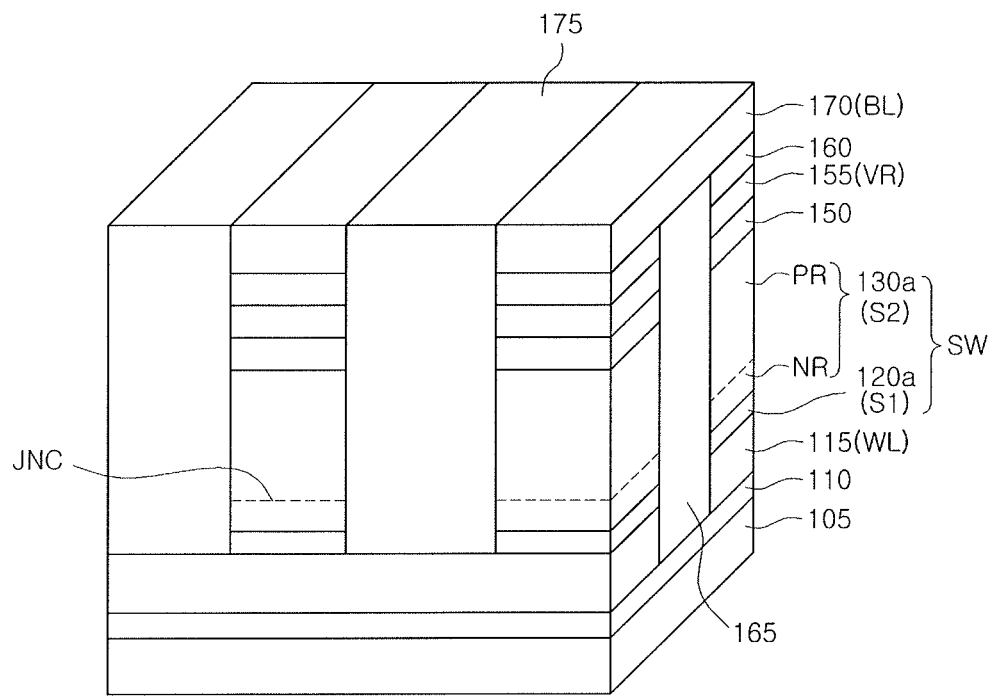

With reference to FIG. 8C, a second insulating layer 175 may be formed on the substrate including the upper conductive layer 170, and the second insulating layer 175 may be polished. Accordingly, a semiconductor device including features illustrated in FIGS. 1 to 3 may be formed.

With reference to FIGS. 9A to 9E, another example of a method of forming a semiconductor device according to an example embodiment will be described.

Figure 9A:
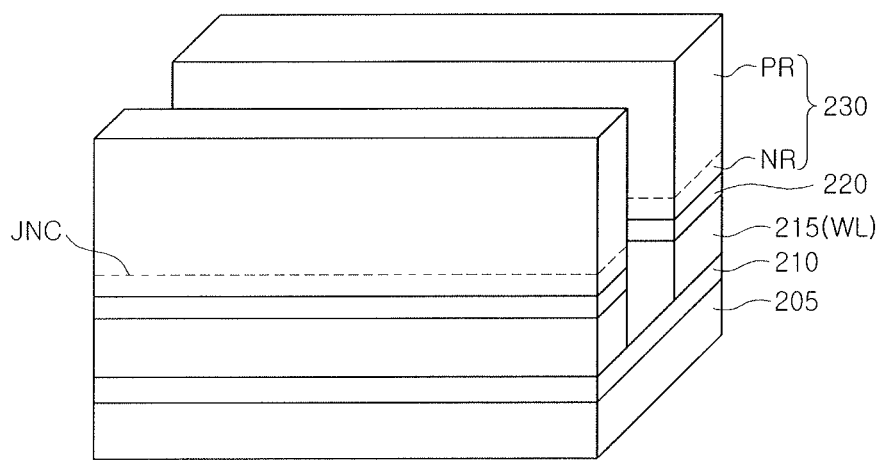
FIGS. 9A to 9E illustrate perspective views of a method of forming a semiconductor device.

With reference to FIG. 9A, a lower insulating layer 210 may be formed on a substrate 205. The substrate 205 may be a semiconductor substrate. A lower conductive layer 215, a first semiconductor layer 220, and a second semiconductor layer 230, may be stacked on the lower insulating layer 210 in sequence, in a linear manner. Forming the lower conductive layer 215, the first semiconductor layer 220, and the second semiconductor layer 230 may include forming the lower conductive layer (15 in FIG. 5E), the first semiconductor layer (20a in FIG. 5E), and the second semiconductor layer (30a in FIG. 5E) using the method as illustrated in FIGS. 5A to 5E and performing a line-and-space patterning process. The line-and-space patterning process may include a photolithography and etching process of forming a line pattern.

The lower conductive layer 215 may be the first conductive line illustrated in FIGS. 1 and 2. For example, the lower conductive layer 215 may be a word line WL.

Figure 9B:
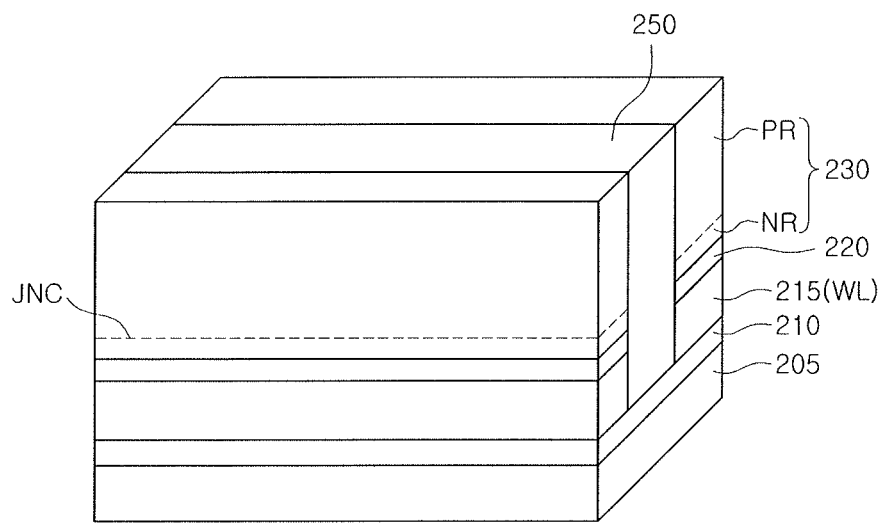

With reference to FIG. 9B, a first insulating layer 250 may be formed on the substrate including the lower conductive layer 215, the first semiconductor layer 220, and the second semiconductor layer 230. The first insulating layer 250 may be polished. The first insulating layer 250 may be formed using an insulating material, such as a silicon oxide, or the like.

Figure 9C:
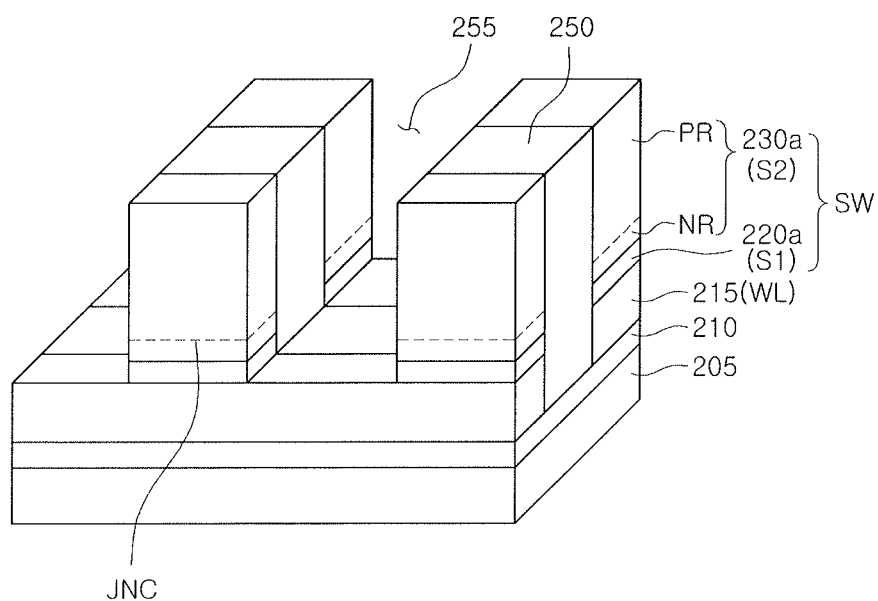

With reference to FIG. 9C, the first semiconductor layer (220 in FIG. 9B), the second semiconductor layer (230 in FIG. 9B), and the first insulating layer 250 may be patterned, thus forming a groove portion 255. The groove portion 255 may have a line shape to intersect the lower conductive layer 215 having a line shape and to allow the lower conductive layer 215 to be exposed.

The first semiconductor layer (220 in FIG. 9B) and the second semiconductor layer (230 in FIG. 9B) may be patterned, thus forming a first semiconductor layer 220a and a second semiconductor layer 230a having a pillar form that extends in a direction upwards from the lower conductive layer 215. The first semiconductor layer 220a and the second semiconductor layer 230a may form the switching device SW, as illustrated in FIGS. 1 to 3. The first semiconductor layer 220a may correspond to the first semiconductor layer S1 illustrated in FIGS. 2 and 3, and the second semiconductor layer 230a may correspond to the second semiconductor layer S2 illustrated in FIGS. 2 and 3.

Figure 9D:
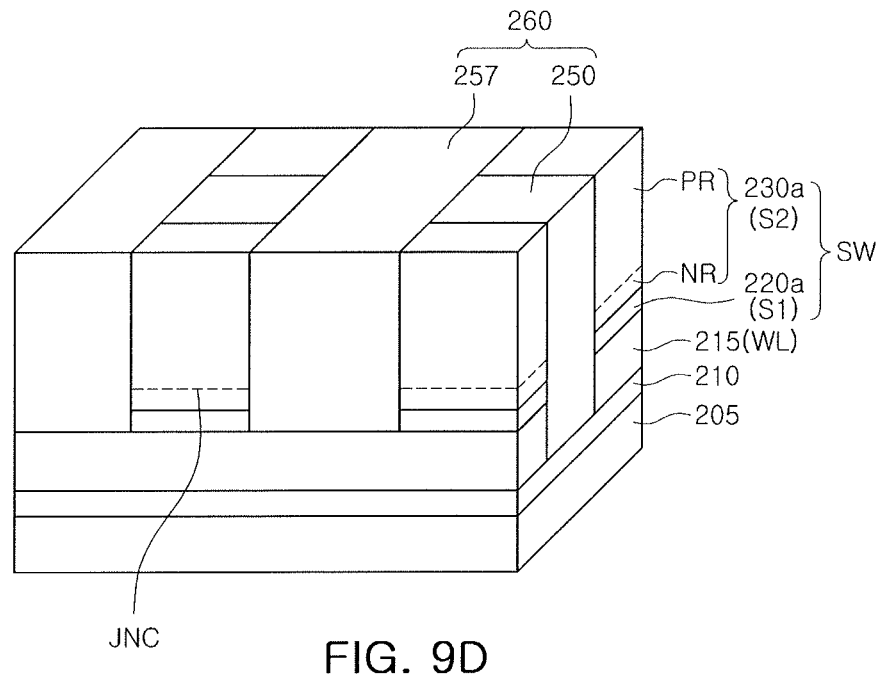

With reference to FIG. 9D, a second insulating layer 257 filling the groove portion (255 in FIG. 9C) may be formed. The first insulating layer 250 and the second insulating layer 257 may provide an interlayer insulating layer 260.

Figure 9E:
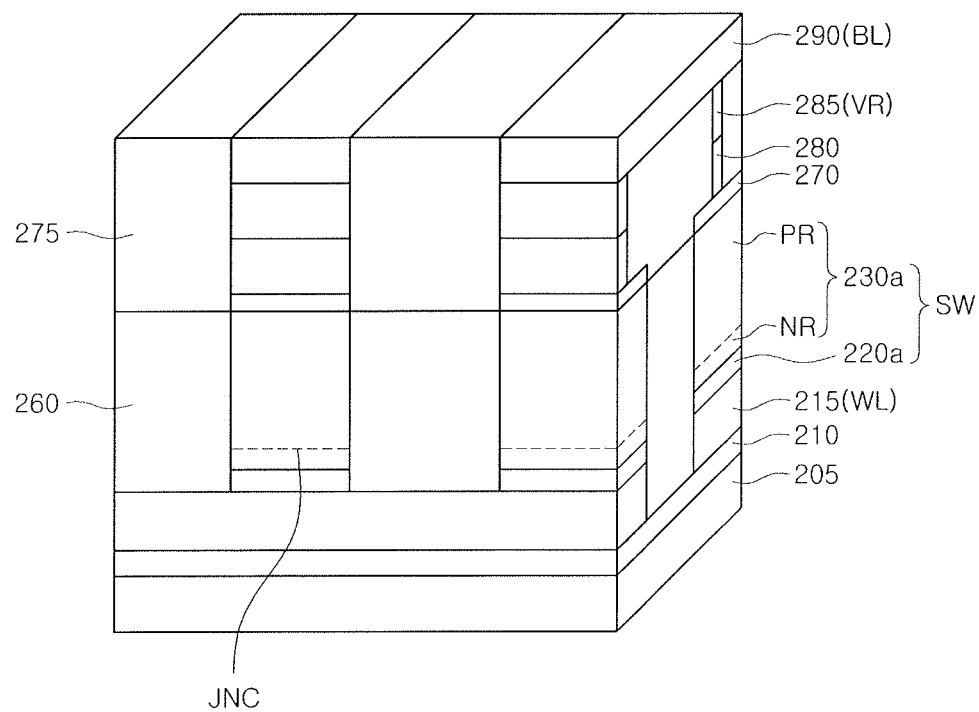

With reference to FIG. 9E, a contact structure 270 may be formed on the second semiconductor layer 230a. The contact structure 270 may include a metallic material, such as a metallic silicide, a metal, a metallic nitride, or the like. An electrode 280 and a data storage element 285 may be stacked on the contact structure 270 in sequence. The data storage element 285 may be the data storage element VR illustrated in FIGS. 1 and 2. An upper conductive layer 290 may be formed on the data storage element 285. The upper conductive layer 290 may be the second conductive line, as illustrated in FIGS. 1 and 2. For example, the upper conductive layer 290 may be a bit line BL. Accordingly, another semiconductor device including features illustrated in FIGS. 1 to 3 may be formed.

Figure 10:
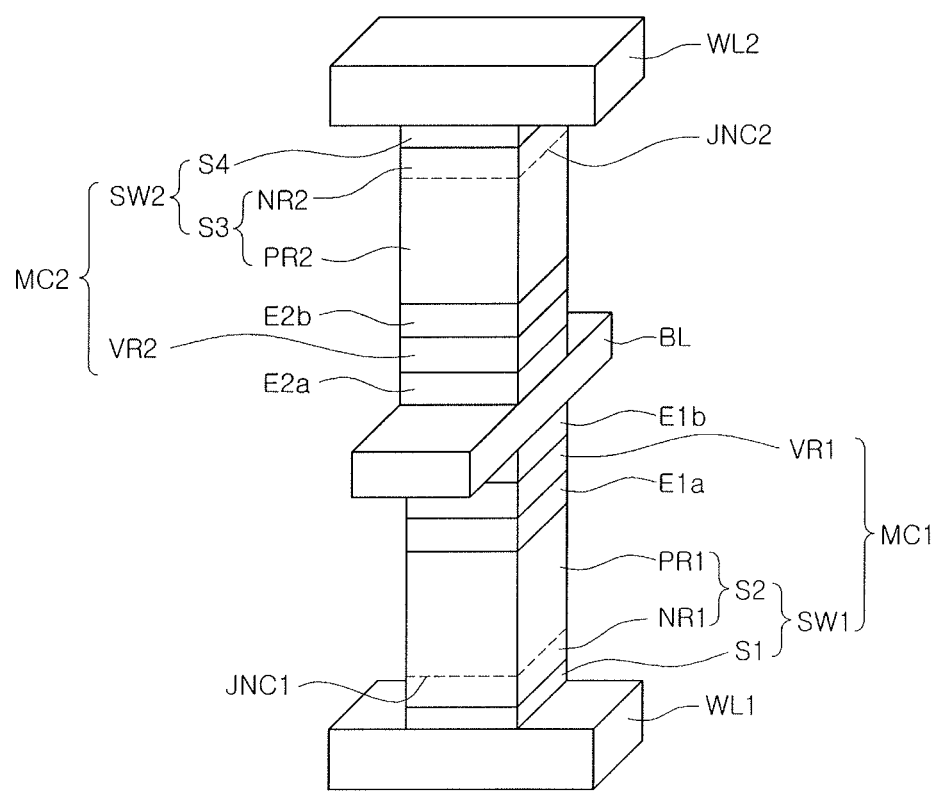
FIG. 10 illustrates a perspective view of a semiconductor device according to a modified example embodiment.

With reference to FIG. 10, a semiconductor device according to an example embodiment will be described.

With reference to FIG. 10, the semiconductor device according to an example embodiment may include a first conductive line WL1, a second conductive line BL above the first conductive line WL1, and a third conductive line WL2 above the second conductive line BL. The first conductive line WL1 and the third conductive line WL2 may have a line shape extending in the same direction. The second conductive line BL may have a shape extending in a direction perpendicular to the first conductive line WL1 and the third conductive line WL2, in a plan view.

The first conductive line WL1 may be a first word line. The first conductive line WL1 may be the same as the first conductive line WL illustrated in FIGS. 1 and 2. The second conductive line BL may be a bit line. The second conductive line BL may be the same as the second conductive line BL illustrated in FIGS. 1 and 2. The semiconductor device may include a first memory cell MC1 formed between the first conductive line WL1 and the second conductive line BL, and a second memory cell MC2 formed between the second conductive line BL and the third conductive line WL2.

The first memory cell MC1 may include a first switching device SW1 and a first data storage element VR1, which may be connected to each other in series. The first memory cell MC1 may be the same as the memory cell MC illustrated in FIGS. 1 and 2.

The first switching device SW1 may include the first semiconductor layer 51 and the second semiconductor layer S2, as illustrated in FIGS. 1 to 3. The first semiconductor layer S1 may have n-type conductivity. The second semiconductor layer S2 may include an n-type conductive region NR1 and a p-type conductive region PR1. The second semiconductor layer S2 may include a P-N junction JNC, as illustrated in FIGS. 2 and 3, formed therein (indicated in FIG. 10 as "JNC1"). A first electrode E1a may be formed between the first switching device SW1 and the first data storage element VR1. A second electrode E1b may be formed between the second conductive line BL and the first data storage element VR1.

The second memory cell MC2 may include the second switching device SW2 and the second data storage element VR2, which may be connected to each other in series. In an example embodiment, the second data storage element VR2 may be disposed more adjacently to the second conductive line BL than to the second switching device SW2. A third electrode E2a may be formed between the second data storage element VR2 and the second conductive line BL. A fourth electrode E2b may be formed between the second switching device SW2 and the second data storage element VR2.

The second switching device SW2 may be a P-N diode. The second switching device SW2 may include a third semiconductor layer S3 and a fourth semiconductor layer S4. The fourth semiconductor layer S4 may be between the third semiconductor layer S3 and the third conductive line WL2. The fourth semiconductor layer S4 may have n-type conductivity. The third semiconductor layer S3 may include a p-type conductive region PR2 and an n-type conductive region NR2. In the third semiconductor layer S3, the n-type conductive region NR2 may be in contact with the fourth semiconductor layer S4.

A P-N junction JNC2 in the third semiconductor layer S3 may be disposed more adjacently to a second plane of the third semiconductor layer S3 than to a first plane thereof. In the third semiconductor layer S3, the first plane is a surface disposed adjacently to the data storage element VR, while the second plane is a surface in contact with the fourth semiconductor layer S4.

Hereinafter, a stages of a method of forming a semiconductor device according to an example embodiment described with reference to FIG. 10 will be described, with reference to FIGS. 11A to 11D. In the semiconductor device according to an example embodiment described with reference to FIG. 10, the first conductive line WL1, and the second conductive line BL, and the first memory cell MC1 may be formed in a manner similar to that described with reference to FIGS. 5A to 9E.

Hereinafter, a method of forming the second switching device SW2 in FIG. 10 will be described. An example embodiment of the method of forming a semiconductor device may include forming the third electrode E2a, the second data storage element VR2, and the fourth electrode E2b, as illustrated in FIG. 10, on a structure formed using a method as illustrated in FIGS. 8A to 8C. The method may include forming the second switching device SW2 and the third conductive line WL2 on the fourth electrode E2b. Hereinafter, with reference to FIGS. 11A to 11D, an example embodiment of the method of the second switching device SW2 on the fourth electrode E2b will be described.

Figure 11A:
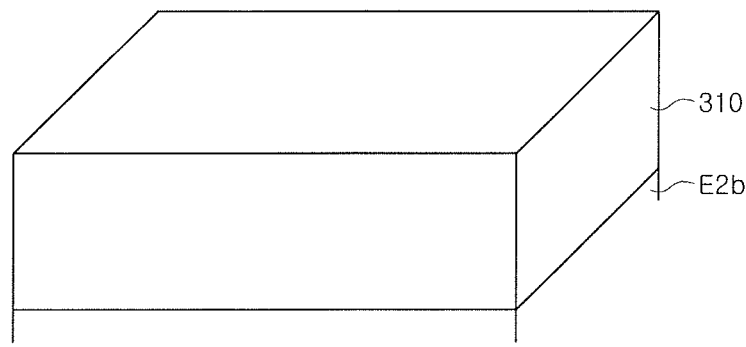
FIGS. 11A to 11D illustrate perspective views illustrating an example of stages of a method of forming a semiconductor device according to a modified example embodiment.

With reference to FIGS. 10 and 11A, a third semiconductor layer 310 may be formed on the fourth electrode E2b. The third semiconductor layer 310 may be formed using an undoped silicon material.

Figure 11B:
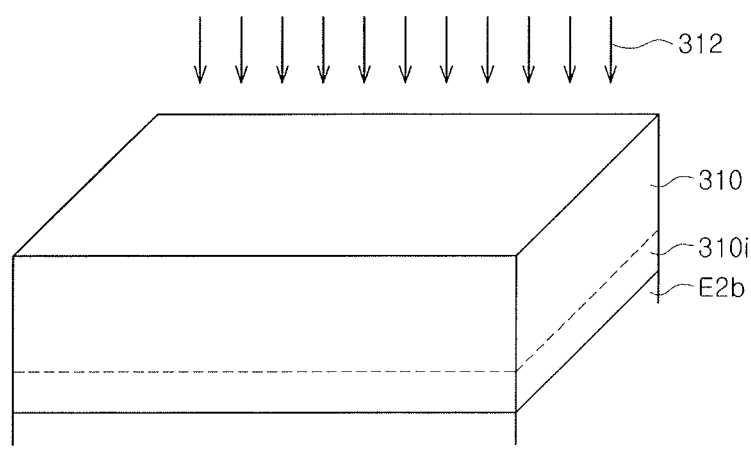

With reference to FIGS. 10 and 11B, a third doped region 310i may be formed in a lower region of the third semiconductor layer 310 using a third doping process 312. The third doped region 310i may include an impurity the same as that of the second doped region (30i) illustrated in FIG. 5D. For example, the third doped region 310i may include a p-type impurity, such as B.

Figure 11C:
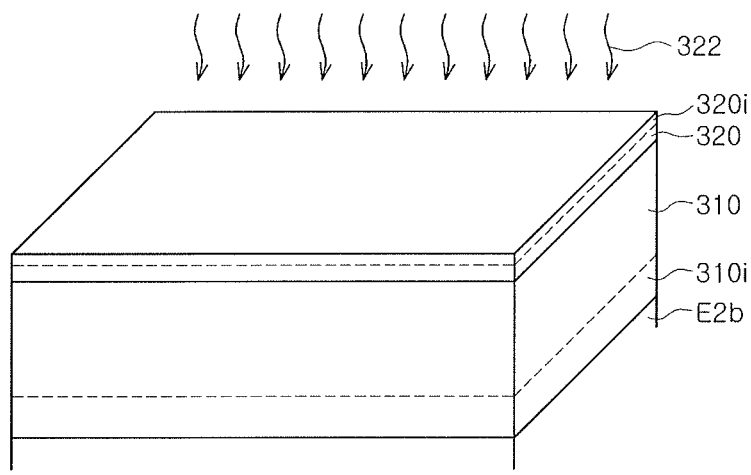

With reference to FIGS. 10 and 11C, a fourth semiconductor layer 320 may be formed on the third semiconductor layer 310 including the third doped region 310i. The fourth semiconductor layer 320 may be thinner than the third semiconductor layer 310. For example, the fourth semiconductor layer 320 may have a thickness in a range of about 10 Å to about 50 Å. The third semiconductor layer 310 may be about 5 to about 15 times thicker than the fourth semiconductor layer 320.

A fourth doped region 320i may be formed in an upper region of the fourth semiconductor layer 320 using a fourth doping process 322. The fourth doping process 322 may be the same as the first doping process (22) illustrated in FIG. 5B. The fourth doped region 320i may include the impurity, such as P, As, or the like.

Figure 11D:
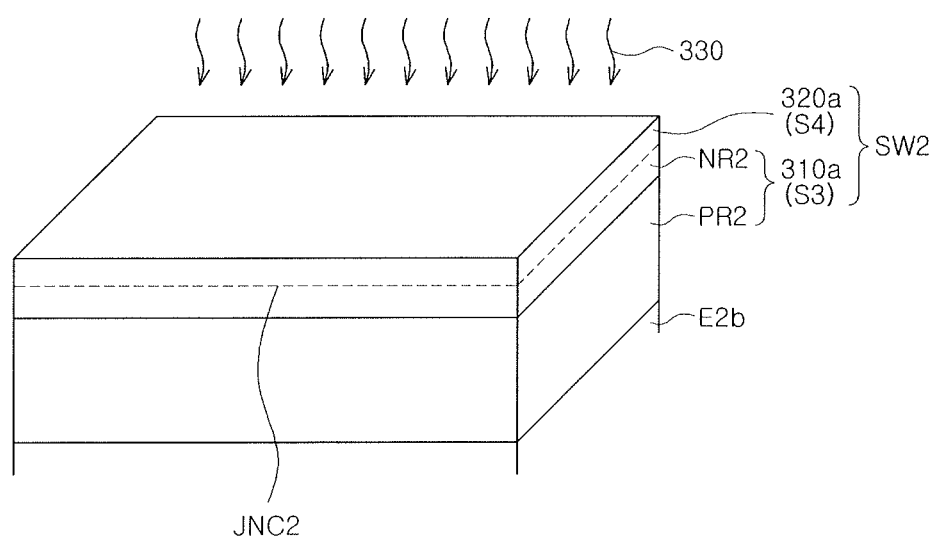

With reference to FIGS. 10 and 11D, a P-N diode SW may be formed using a heat treatment process 330. Through the heat treatment process 330, the fourth semiconductor layer (320 in FIG. 11C) may be provided as a fourth semiconductor layer 320a having n-type conductivity. In addition, the third semiconductor layer (310 in FIG. 11C) may be provided as a third semiconductor layer 310a including the n-type conductive region NR2 and the p-type conductive region PR2. The third semiconductor layer 310a may include the P-N junction JNC2 formed therein. The n-type conductive region NR2 of the third semiconductor layer 310a may be in contact with the fourth semiconductor layer 320a. Therefore, the second memory cell MC2 including the second switching device SW2, as illustrated in FIG. 10, may be formed.

By way of summation and review, In the P-N diode SW (for example, SW1 or SW2) formed according to example embodiments and used as a switching device of the memory cell MC (for example, MC1 or MC2), the first semiconductor layer S1 or S4 may be formed to have the thickness of about 50Å or less. Therefore, a size of the P-N diode SW may be reduced, and a degree of integration in the semiconductor device may be increased.

According to example embodiments, a method of controlling an impurity concentration and a depth of the P-N junction JNC may be provided, and an off current (Ioff) of a memory cell adopting the P-N diode SW as the switching device may be reduced. Therefore, the semiconductor device having improved electrical characteristics may be provided.

As set forth above, according to example embodiments, a method of forming a P-N diode, reducing a size of the P-N diode and a method of forming a semiconductor device using the method of forming a P-N diode may be provided. The semiconductor device formed using the method may include the P-N diode having a reduced size. Therefore, a degree of integration in the semiconductor device may be increased, according to example embodiments.

According to example embodiments, a method of forming the P-N diode, reducing an off current (Ioff) and a method of forming the semiconductor device using the method of forming the P-N diode may be provided. Therefore, the semiconductor device having improved electrical characteristics may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of forming a semiconductor device, the method comprising:
    forming a first conductive line on a substrate;
    forming a memory cell including a switching device and a data storage element on the first conductive line; and
    forming a second conductive line on the memory cell,
    wherein forming the switching device includes:
        forming a first semiconductor layer;
        forming a first doped region using a first doping process of injecting a n-type impurity into the first semiconductor layer;
        forming a second semiconductor layer to be thicker than the first semiconductor layer, on the first semiconductor layer having the first doped region;
        forming a second doped region using a second doping process of injecting a p-type impurity into an upper region of the second semiconductor layer; and
        forming a P-N diode by performing a heat treatment process to diffuse the n-type impurity and the p-type impurity in the first doped region and the second doped region such that a P-N junction of the P-N diode is formed in the second semiconductor layer.

2. The method as claimed in claim 1, further comprising:
    before the first doping process is performed, forming the first semiconductor layer using a first undoped polysilicon material, and
    before the second doping process is performed, forming the second semiconductor layer using a second undoped polysilicon material.

3. The method as claimed in claim 1, wherein the first doped region is formed in an upper region of the first semiconductor layer.

4. The method as claimed in claim 1, wherein after the heat treatment process is performed, the first semiconductor layer has an n-type conductivity, and the second semiconductor layer includes a first region having n-type conductivity and a second region having p-type conductivity, the first region of the second semiconductor layer being in contact with the first semiconductor layer.

5. The method as claimed in claim 1, wherein the P-N junction is formed to be disposed more adjacently to a lower surface of the second semiconductor layer than to an upper surface of the second semiconductor layer.

6. The method as claimed in claim 1, wherein the P-N junction is formed to be disposed more adjacently to a lower surface of the first semiconductor layer than to the upper surface of the second semiconductor layer.

7. The method as claimed in claim 1, wherein the P-N junction is formed to be disposed more adjacently to a maximum peak region of a concentration of the n-type impurity in the first semiconductor layer than to a maximum peak region of a concentration of the p-type impurity in the second semiconductor layer.

8. The method as claimed in claim 1, wherein the P-N diode is formed such that a concentration of the n-type impurity in the first semiconductor layer has a first peak and a second peak lower than the first peak, the first peak being a maximum peak in the first semiconductor layer.

9. The method as claimed in claim 8, wherein the second peak is formed to be disposed more adjacently to the lower surface of the first semiconductor layer than the first peak.

10. The method as claimed in claim 7, wherein after the heat treatment process is performed, the first semiconductor layer is formed to have n-type conductivity, the second semiconductor layer is formed to have the first region having n-type conductivity and the second region having p-type conductivity, and an interface between the first region and the second region is formed to be provided as the P-N junction.

11. A method of forming a semiconductor device, the method comprising:
    forming a first semiconductor layer on a lower conductive layer, the first semiconductor layer being formed of a first undoped silicon layer;
    forming a first doped region including an n-type impurity in the first semiconductor layer using a first doping process;
    forming a second semiconductor layer to be thicker than the first semiconductor layer, on the first semiconductor layer including the first doped region, the second semiconductor layer being formed of a second undoped silicon layer;
    forming a second doped region including a p-type impurity in an upper region of the second semiconductor layer using a second doping process; and
    forming a P-N diode in which a P-N junction is formed in the second semiconductor layer by performing a heat treatment process to diffuse the n-type impurity and the p-type impurity in the first doped region and the second doped region.

12. The method as claimed in claim 11, wherein the first semiconductor layer is formed to have a thickness in a range of 10Å to 50Å.

13. The method as claimed in claim 11, wherein the second semiconductor layer is formed to have the thickness 5 to 15 times greater than the thickness of the first semiconductor layer.

14. The method as claimed in claim 11, wherein after the heat treatment process is performed, an entirety of the first semiconductor layer is formed to have n-type conductivity; the second semiconductor layer is formed to include a first region having n-type conductivity, formed in such a manner that the n-type impurity in the first doped region is diffused and a second region having p-type conductivity, formed in such a manner that the p-type impurity in the second doped region is diffused; and an interface between the first region and the second region is formed to be disposed more adjacently to a lower surface of the second semiconductor layer than to an upper surface of the second semiconductor layer.

15. The method as claimed in claim 11, wherein after the heat treatment process is performed, a maximum peak of a concentration of the n-type impurity in the first semiconductor layer is formed to be disposed adjacently to the lower conductive layer, and a maximum peak of a concentration of the p-type impurity in the second semiconductor layer is formed to be disposed adjacently to the upper surface of the second semiconductor layer.

16. A method of forming a semiconductor device, the method comprising:

forming a first layer of undoped silicon on a first conductive layer;

forming a first doped region including an n-type impurity in the first layer to form a first semiconductor layer;

forming a second layer of undoped silicon on the first semiconductor layer including the first doped region;

forming a second doped region including a p-type impurity in an upper region of the second layer to form a second semiconductor layer;

performing a heat treatment process to diffuse the n-type impurity and the p-type impurity in the first doped region and the second doped region to form a first P-N diode including a first P-N junction in the second semiconductor layer;

forming a first electrode layer on the first P-N diode;

forming a first data storage element on the first electrode layer;

forming a second electrode layer on the first data storage element; and forming an second conductive layer on the second electrode layer.

17. The method as claimed in claim 16, wherein the first semiconductor layer is formed to have a thickness in a range of 10 Å to 50 Å.

18. The method as claimed in claim 17, wherein the second semiconductor layer is formed to have the thickness 5 to 15 times greater than the thickness of the first semiconductor layer.

19. The method as claimed in claim 16, further comprising, before forming the second conductive layer:

performing a first patterning process on the first conductive layer, the first P-N diode, the first electrode layer, the first data storage element and the second electrode layer to form a line-and-space pattern having lines in a first direction;

depositing a first insulating layer to fill space in the line-and-space pattern and cover the first P-N diode, first electrode layer, first data storage element and second electrode layer of the line-and-space pattern; and performing a second patterning process on the first P-N diode, the first electrode layer, the first data storage element and the second electrode layer such that the first P-N diode, the first electrode layer, the first data storage element and the second electrode layer have a pillar form, and wherein the second conductive layer is formed in a line shape intersecting the lower conductive layer in a plan view.

20. The method as claimed in claim 17, further comprising:

forming a third electrode layer on the second conductive layer;

forming a second data storage element on the third conductive layer;

forming a fourth electrode layer on the data storage element;

forming a second P-N diode on the fourth electrode layer; and forming a third conductive layer on the second P-N diode, the third conductive layer having a line shape in a same direction as the first conductive layer.

* * * * *